United States Patent
Shibata

(10) Patent No.: US 8,435,844 B2
(45) Date of Patent: May 7, 2013

(54) SEMICONDUCTOR DEVICE MANUFACTURING METHOD

(75) Inventor: Mayumi Shibata, Miyagi (JP)

(73) Assignee: Lapis Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/281,465

(22) Filed: Oct. 26, 2011

(65) Prior Publication Data

US 2012/0135572 A1     May 31, 2012

(30) Foreign Application Priority Data

Nov. 26, 2010   (JP) ................................. 2010-263486

(51) Int. Cl.
    *H01L 21/00*       (2006.01)
    *H01L 21/84*       (2006.01)

(52) U.S. Cl.
    USPC ..... 438/163; 438/271; 438/305; 257/E21.618

(58) Field of Classification Search ............... 438/163, 438/271, 276, 289, 301, 302, 305, 306; 257/E21.618
See application file for complete search history.

(56) References Cited

U.S. PATENT DOCUMENTS

2008/0211031 A1*   9/2008   Sakuma ..................... 257/368

FOREIGN PATENT DOCUMENTS

JP      10-012870 A      1/1998

* cited by examiner

*Primary Examiner* — Thanhha Pham
(74) *Attorney, Agent, or Firm* — Rabin & Berdo, P.C.

(57) ABSTRACT

A gate electrode is formed on a surface of a semiconductor substrate. A resist mask is formed that covers both end faces of the gate electrode in a gate width direction intersecting a gate length direction. Impurity ions are implanted into the semiconductor substrate in an implantation direction having a gate length direction component and a gate width direction component, to form a low-concentration impurity layer overlapping with the gate electrode at both sides of the gate electrode in the surface of the semiconductor substrate. A sidewall is formed that covers a side surface of the gate electrode. Impurity ions are implanted using the gate electrode and the sidewall as a mask, to form a high-concentration impurity layer apart from the gate electrode at both sides of the gate electrode on the surface of the semiconductor substrate.

5 Claims, 7 Drawing Sheets

SEMICONDUCTOR DEVICE MANUFACTURING METHOD

BACKGROUND OF THE INVENTION

1. Field of the Invention

The present invention relates to a method of manufacturing a semiconductor device.

2. Description of the Related Art

A reduction in the size of a semiconductor element enables not only an integration of even more circuits per unit area, but also enables a drive of the semiconductor element at a lower voltage and at a lower current to suppress the power consumption. The reduction in the size of the semiconductor element, however, brings about a shift in the device characteristics from the long channel approximation. Specifically, the shift includes a fluctuation of the threshold voltage, a lowering of the source and drain withstand voltage, and an increase of the source-to-drain leakage current in a weak inversion state. These phenomena are generally called short channel effect. An LDD (lightly-doped-drain) structure is known as a scheme for preventing the short channel effect. The LDD structure is a structure in which a low impurity concentration region intervenes between high impurity concentration drain and source regions and channel region. Employment of the LDD structure weakens the electric field in the vicinity of the ends of the drain and the source, to improve the withstand voltage thereof.

Patent Document 1 (Japanese Laid-Open Patent Publication No. 10-12870) describes a semiconductor device and a fabrication method of the same, the semiconductor device having a low-concentration impurity layer and a high-concentration impurity layer that are disposed overlapping with a gate electrode between the high impurity concentration drain and source regions and channel region.

SUMMARY OF THE INVENTION

When forming the low-concentration impurity layer so as to overlap with the gate electrode in a MOSFET (Metal-Oxide-Semiconductor Field-Effect-Transistor) having the LDD structure, an ion implantation is carried out at a tilt angle of e.g. 45° with respect to the substrate.

FIG. 1A is a top plan view of a common MOSFET 100. The MOSFET 100 has an active area 40 including a high-concentration impurity layer 44, a low-concentration impurity layer 42, and a channel region 46, an isolation film 20 surrounding the active area 40, and a gate electrode 34 extending so as to cross the active area 40. When arranging the low-concentration impurity layer 42 so as to overlap with the gate electrode 34, an ion implantation is carried out in an ion implantation direction having a direction-A component and a direction-B component along a gate length direction (i.e., a direction where the drain, gate and source are aligned) depicted in FIG. 1. In the case where in another region there exists another MOSFET having a gate length direction different from that of the MOSFET 100, an ion implantation is further effected in an ion implantation direction having direction-C component and direction-D component depicted in FIG. 1. In this case, if the gate electrode 34 has a small extension length L1 from the active area 40 in a direction orthogonal to the gate length direction, implanted ions may possibly penetrate through the gate electrode 34 and the isolation film 20 into the interior of the channel region 46, as depicted in FIGS. 1B and 1C, resulting in a formation of a leakage path. In order to avoid the formation of the leakage path, the extension length L1 of the gate electrode 34 needs to be increased to prevent the ion penetration. If the extension length L1 of the gate electrode 34 is increased, however, the device size becomes large, making it impossible to meet the requirements for an increase in the density and a reduction in the size of the semiconductor device.

FIG. 2 is a graph representing a result of the comparison of the leakage current between a case (broken line) of the gate electrode extension length L1 of 0.2 μm and a case (solid line) of 0.4 μm. In FIG. 2, the axis of abscissas represents a gate voltage, and the axis of ordinates represents a drain current. As can been seen, the leakage current is larger when the extension length L1 of the gate electrode is 0.2 μm, whereas this can be avoided by increasing the extension length L1 up to 0.4 μm.

The present invention was conceived in view of the above circumstances, and it is therefore an object to provide a method of manufacturing a semiconductor device including a step of performing an ion implantation from a slant direction with respect to a substrate, the method achieving concurrently both a reduction in the size of the gate electrode and an improvement in the leakage current characteristics.

According to a first aspect of the present invention there is provided a method of manufacturing a semiconductor device, comprising the steps of forming a gate electrode on a surface of a semiconductor substrate; forming a resist mask covering both end faces of the gate electrode in a gate width direction intersecting a gate length direction; forming a low-concentration impurity layer in the surface of the semiconductor substrate so as to overlap with the gate electrode at both sides of the gate electrode by implanting impurity ions into the semiconductor substrate in an implantation direction having a gate length direction component and a gate width direction component; forming a sidewall covering a side surface of the gate electrode; and forming a high-concentration impurity layer in the surface of the semiconductor substrate so as to be apart from the gate electrode at both sides of the gate electrode by implanting impurity ions using the gate electrode and the side wall as a mask.

According to a second aspect of the present invention there is provided a method of manufacturing a semiconductor device including a plurality of semiconductor elements each having a gate length direction different from one another, the method comprising the steps of forming a plurality of gate electrodes corresponding respectively to the plurality of semiconductor elements on a surface of a semiconductor substrate; forming a resist mask covering both end faces of each of the plurality of gate electrodes in a gate width direction intersecting the gate length direction; forming a low-concentration impurity layer in the surface of the semiconductor substrate so as to overlap with each of the plurality of gate electrodes at both sides of the each of the plurality of gate electrodes by implanting impurity ions into the semiconductor substrate in an implantation direction having a gate length direction component and a gate width direction component; forming a sidewall covering a side surface of each of the plurality of gate electrodes; and forming a high-concentration impurity layer in the surface of the semiconductor substrate so as to be apart from each of the plurality of gate electrodes at both sides of the each of the plurality of gate electrodes by implanting impurity ions using the plurality of gate electrodes and the side walls as a mask.

According to the semiconductor device manufacturing method of the present invention, even though an ion implantation is carried out at a tilt angle having a gate width direction component orthogonal to the gate length direction when forming a low-concentration impurity layer, both end faces of the gate electrode in the gate width direction are covered by the resist mask, whereupon an ion implantation to the channel region immediately under the gate electrode is prevented so that a formation of the leak path within the channel region can be prevented. The present invention achieves concurrently both a reduction in the size of the gate electrode and an improvement in the leakage current characteristics.

DETAILED DESCRIPTION OF THE INVENTION

Figure 1A:
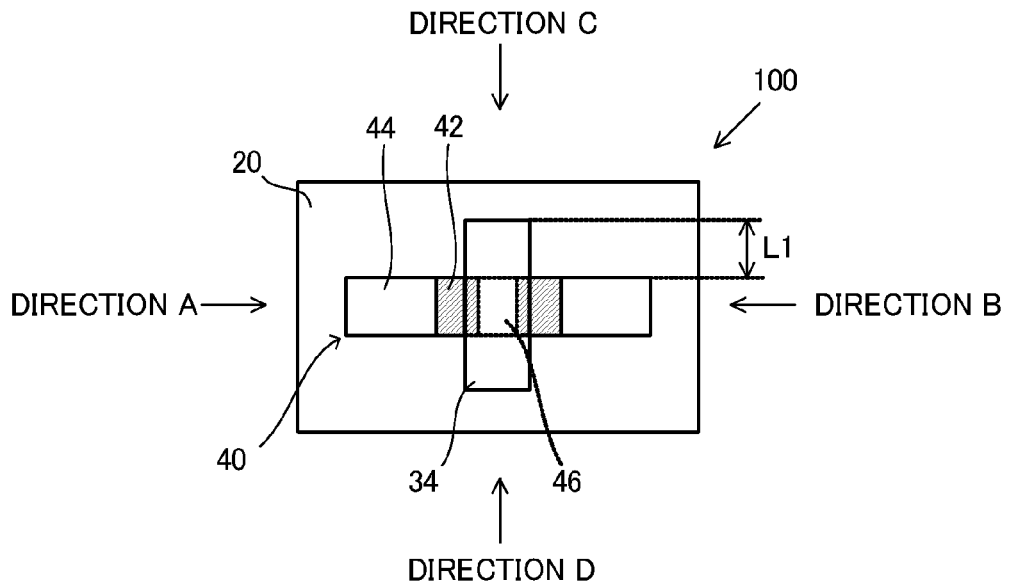
FIGS. 1A and 1B are top plan views of a structure of a MOSFET.
Figure 1B:
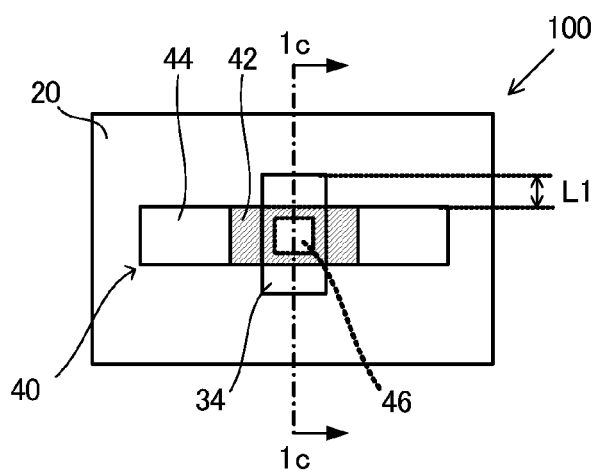
Figure 1C:
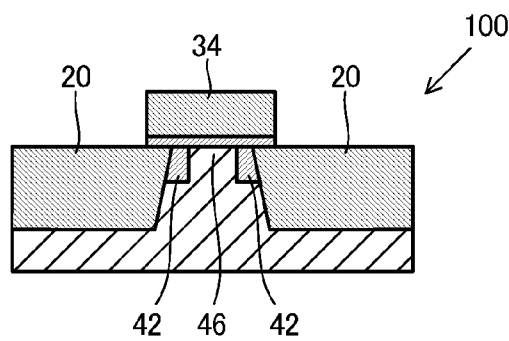
FIG. 1C is a cross-sectional view taken along line 1c-1c of FIG. 1B.
Figure 2:
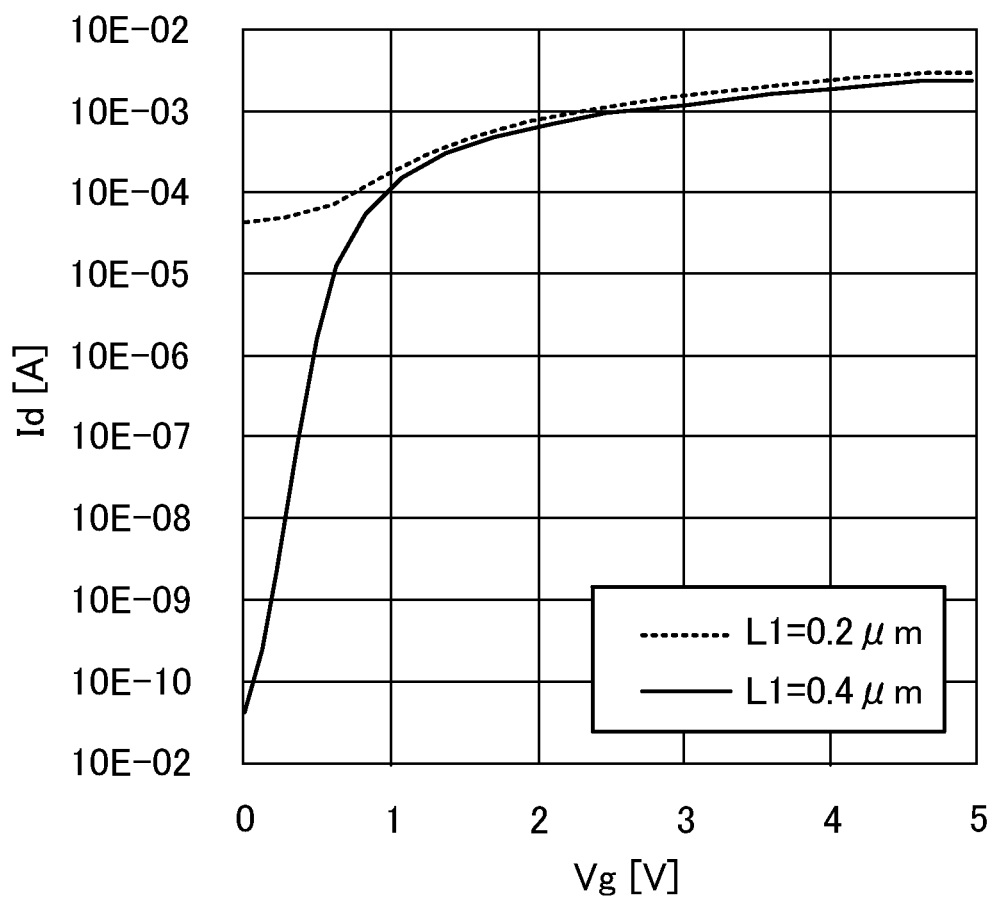
FIG. 2 is a graphical representation of leakage current characteristic of the MOSFET.
Figure 3A:
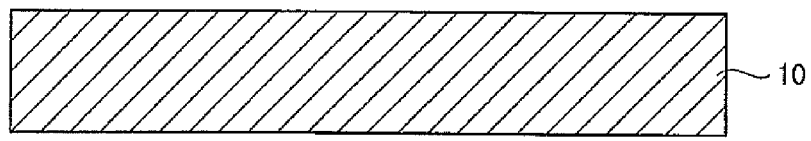
FIGS. 3A to 3E are cross-sectional views of manufacturing steps of a CMOS-type IC according to an embodiment of the present invention.

An exemplary embodiment of the present invention will now be described with reference to the accompanying drawings in which substantially the same or equivalent constituent elements or portions are designated by the same reference numerals. The following description will be given, by way of example, of the case where n-type MOSFETs and p-type MOSFETs are respectively formed on an n-MOS formation region 2 and a p-MOS formation region 3 which adjoin each other. FIGS. 3A to 3E and FIGS. 4A to 4D are cross-sectional views of manufacturing steps of a CMOS-type IC according to an embodiment of the present invention A p-type silicon substrate 10 is prepared, cleansed by an acid solution, rinsed by ultrapure water, and then dried by a centrifugal dryer (FIG. 3A).

Figure 3B:
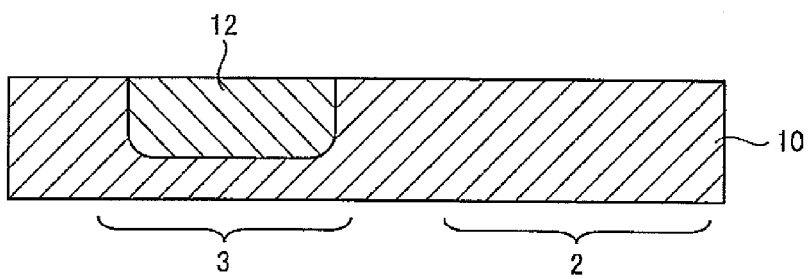

A resist mask is then formed so as to cover a surface of the n-MOS formation region 2 of the silicon substrate 10, and thereafter a phosphorus ion is implanted into an exposed surface of the silicon substrate 10 that is not covered by the resist so that an n-well 12 is formed in the p-MOS formation region (FIG. 3B).

Figure 3C:
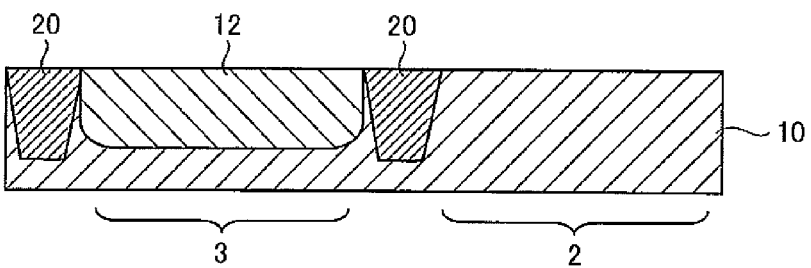

An isolation film 20 is then formed for electrically isolating the n-MOS formation region 2 and the p-MOS formation region 3. The isolation film 20 may be formed by, e.g., an STI (Shallow Trench Isolation) method or a LOCOS (local oxidation of silicon) method. In the case of the STI method, grooves are formed in an isolation region of the silicon substrate 10 by a reactive ion etching (RIE) and $SiO_2$ is then embedded in the grooves by a CVD (Chemical Vapor Deposition) method, etc. Afterward, $SiO_2$ is planarized by a CMP (Chemical Mechanical Polishing) (FIG. 3C).

A gate oxide film 32 of $SiO_2$ is then formed on the surface of the silicon substrate 10 by a thermal oxidation method.

Figure 3D:
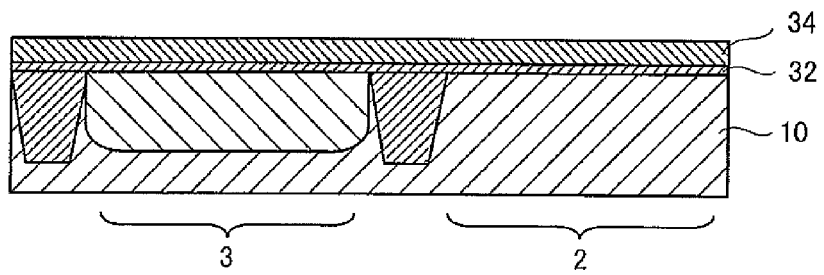

Subsequently, a silane ($SiH_4$) gas is thermally decomposed in a nitrogen ($N_2$) gas atmosphere to form a polycrystal silicon film 34 providing gate electrodes 34n and 34p on the gate oxide film 32 (FIG. 3D). In order to reduce the electric resistance of the polycrystal silicon film 34, an impurity such as phosphorus (P) may be doped thereto (FIG. 3D).

Figure 3E:
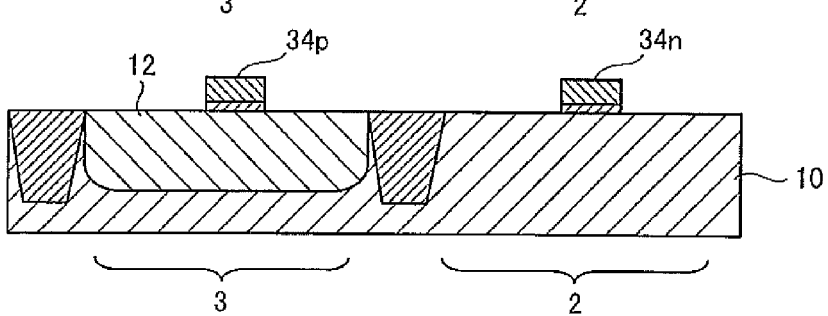

The polycrystal silicon film 34 is then patterned to form the gate electrodes 34n and 34p on the n-MOS formation region 2 and the p-MOS formation region 3, respectively. The gate oxide film 32 is then partly removed with the gate electrodes 34n and 34p used as a mask (FIG. 3E).

Figure 4A:
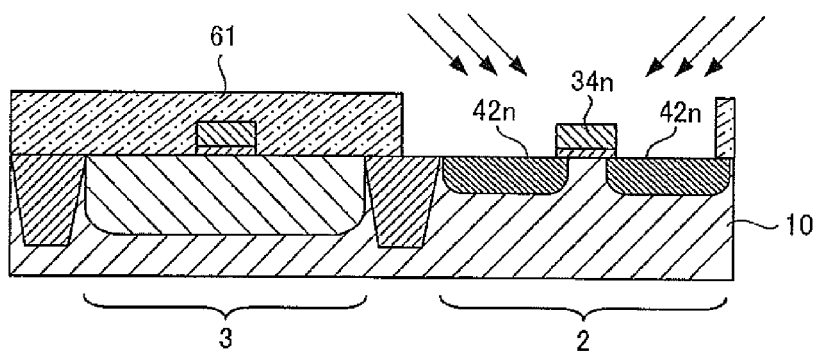
FIGS. 4A to 4D are cross-sectional views of the manufacturing steps of the CMOS-type IC according to the embodiment of the present invention.
Figure 5A:
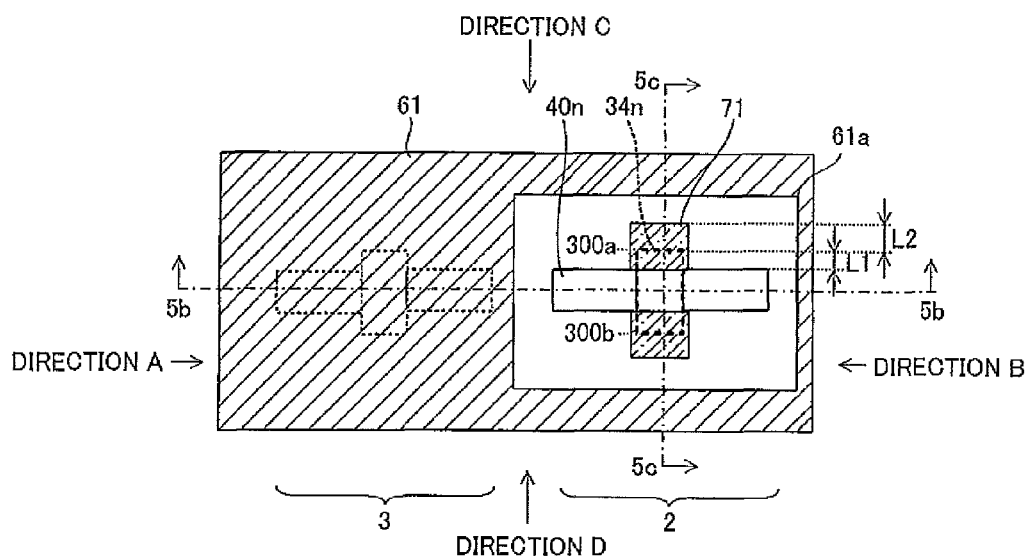
FIG. 5A is a top plan view of the CMOS-type IC in a step of forming a low-concentration impurity layer on an n-MOS formation region.
Figure 5B:
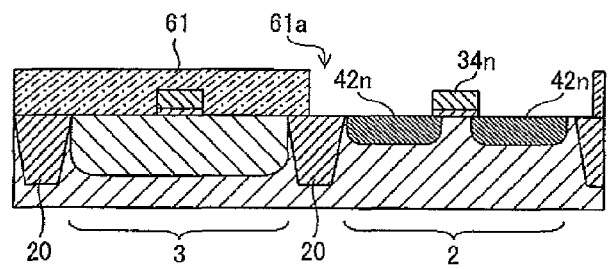
FIGS. 5B and 5C are cross-sectional views taken along lines 5b-5b and 5c-5c, respectively, of FIG. 5A.
Figure 5C:
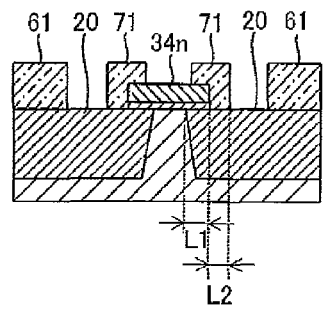

A low-concentration impurity layer 42n is then formed in the n-MOS formation region 2 (FIG. 4A). FIG. 5A is a top plan view of the n-MOS formation region 2 and the p-MOS formation region 3 corresponding to FIG. 4A, and FIGS. 5B and 5C are sectional views taken along lines 5b-5b and 5c-5c, respectively, of FIG. 5A. Resist masks 61 and 71 are formed before the execution of the ion implantation for forming the low-concentration impurity layer 42n. The resist mask 61 is a mask for preventing an ion implantation to the p-MOS formation region 3. The resist mask 61 covers the surface of the p-MOS formation region 3 of the silicon substrate 10 and has an opening 61a on the n-MOS formation region 2. The resist mask 71 covers part of the top surface of the gate electrode 34n exposed in the opening 61a and end faces 300a and 300b of the gate electrode 34n in a direction (hereinafter, referred to as gate width direction) orthogonal to the gate length direction. The gate electrode 34n has a extension length L1 of e.g., 0.2 μm from an active area 40n, and the resist mask 71 has a covering thickness L2 of e.g., 0.3 μm covering the end faces 300a and 300b of the gate electrode 34n. The resist masks 61 and 71 may be made of the same material and may be formed at a time through the same exposure/development processes. That is, an additional step is not required for forming the resist 71 covering the end faces of the gate electrode 34n.

After the formation of the resist masks 61 and 71, phosphorus ions (31P+) are implanted with a dose of $2.0 \times 10^{13}$ atoms/cm$^2$ and an implantation energy of 160 key into the surface of the silicon substrate 10 so that the n-type low-concentration impurity layer 42n is formed at both sides of the gate electrode 34n interposed therebetween. The ion implantation is carried out at an implantation angle of 45° such that the ion implantation direction has a direction-A component and direction-B component along the gate length direction. The low-concentration impurity layer 42n is formed within the active area 40n such that the low-concentration impurity layer 42n overlaps with the gate electrode 34n in a self-aligned manner (or it has a portion extending into the region immediately under the gate electrode).

When additionally forming an n-type MOSFET having a different gate length direction on another n-MOS formation region not shown, in this step the ion implantation is carried out in an implantation direction (a tilt angle) having a direction-C component and direction-D component along the gate width direction. Since the end faces 300a and 300b of the gate electrode 34n are covered by the resist 71 having a predetermined covering thickness, an ion implantation to a channel region immediately under the gate electrode 34n is prevented even in the case of performing the ion implantation having the gate width direction components. Accordingly, no leak path is formed within the channel region. By covering the end faces 300a and 300b of the gate electrode 34n in the gate width direction by the resist 71, substantially the same effect can be obtained as in the case of elongating the extension length L1 of the gate electrode. The covering thickness of the resist 71 covering the both end faces of the gate electrode 34n is set to a thickness capable of preventing the ion implantation to the region immediately under the gate electrode and may appropriately be changed depending on the extension length L1 of the gate electrode 34n, the ion implantation conditions, etc.

Figure 4B:
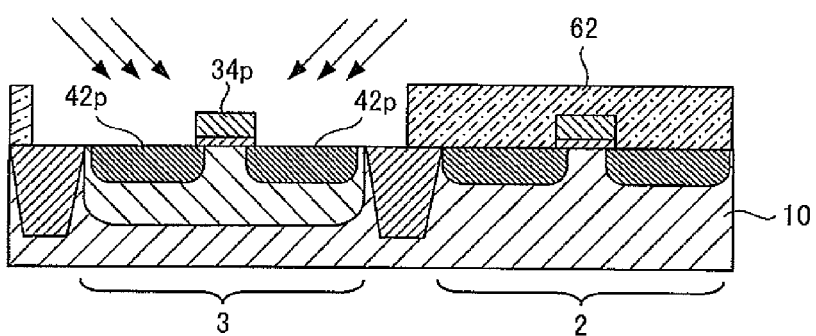
Figure 6A:
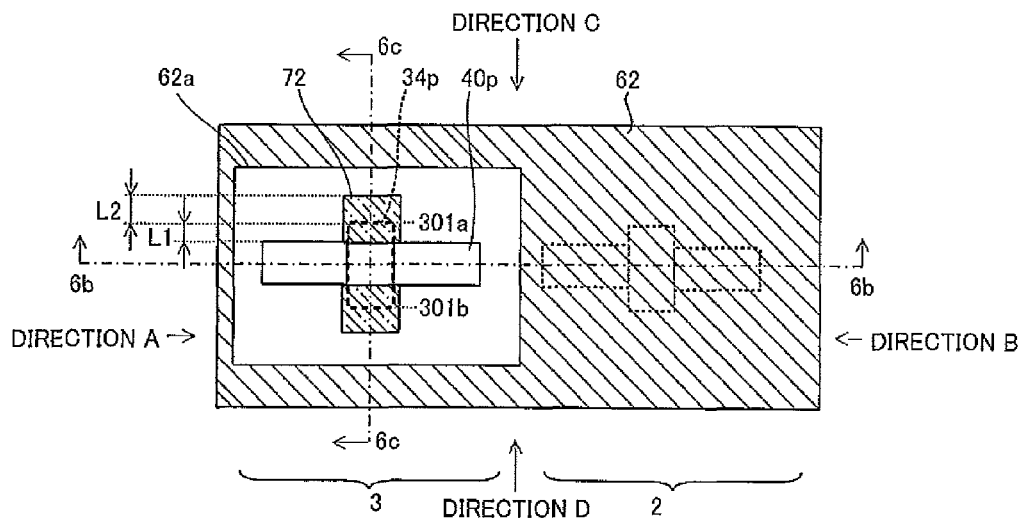
FIG. 6A is a top plan view of the CMOS-type IC in a step of forming the low-concentration impurity layer on the p-MOS formation region.
Figure 6B:
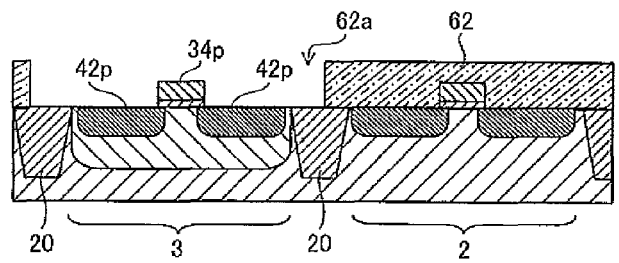
FIGS. 6B and 6C are cross-sectional views taken along lines 6b-6b and 6c-6c, respectively, of FIG. 6A.
Figure 6C:
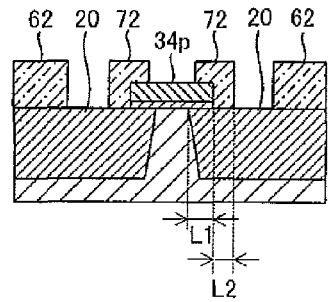

A low-concentration impurity layer 42p is then formed in a similar procedure on the p-MOS formation region 3 (FIG. 4B). FIG. 6A is a top plan view corresponding to FIG. 4B of the n-MOS formation region 2 and the p-MOS formation region 3, and FIGS. 6B and 6C are cross-sectional views taken along lines 6b-6b and 6c-6c, respectively, of FIG. 6A. Resist masks 62 and 72 are formed before the execution of the ion implantation for forming the low-concentration impurity layer 42p on the p-MOS formation region 3. The resist mask 62 is a mask for preventing an ion implantation to the n-MOS formation region 2. The resist mask 62 covers the surface of the n-MOS formation region 2 of the silicon substrate 10 and has an opening 62a on the p-MOS formation region 3. The resist mask 72 covers part of the top surface of the gate electrode 34p exposed in the opening 62a and end faces 301a and 301b of the gate electrode 34p in the gate width direction. The gate electrode 34p has a extension length L1 of e.g., 0.2 μm from an active area 40p, and the resist mask 72 has a covering thickness L2 of e.g., 0.3 μm covering the end faces 301a and 301b of the gate electrode 34p. The resist masks 62 and 72 may be made of the same material and is formed at a time through the same exposure/development processes. That is, an additional step is not required for forming the resist 72 covering the end faces of the gate electrode 34p.

After the formation of the resist masks 62 and 72, boron ions (11B+) are implanted so that the p-type low-concentration impurity layer 42p is formed at both sides of the gate electrode 34p interposed therebetween. The ion implantation is carried out at an implantation angle of 45° in such a manner as to have the direction-A component and a the direction-B component along the gate length direction. The low-concentration impurity layer 42p is formed within the active area 40p such that the low-concentration impurity layer 42p overlaps with the gate electrode 34p in a self-aligned manner (or it has a portion extending into the region immediately under the gate electrode).

When additionally forming a p-type MOSFET having a different gate length direction on another p-MOS formation region not shown, in this step the ion implantation is carried out in an implantation direction (tilt angle) having the direction-C component and the direction-D component along the gate width direction. Since the end faces 301a and 301b of the gate electrode 34p are covered by the resist 72 having a predetermined covering thickness, an ion implantation to a channel region is prevented even in the case of performing the ion implantation having the direction-C component and direction-D component, and hence, no leak path forms within the channel region. By covering the end faces 301a and 301b of the gate electrode 34p by the resist 72, substantially the same effect can be obtained as in the case of elongating the extension length L1 of the gate electrode.

Next, after the removal of the resists 62 and 72, an insulating film of $SiO_2$, etc. is formed on the surface of the silicon substrate 10 such that the gate electrodes 34n and 34p are embedded therein using CVD method, etc. Subsequently, using a reactive ion etching, the insulating film is etched back to form sidewalls 36n and 36p on side surfaces of the gate electrodes 34n and 34p, respectively.

Figure 4C:
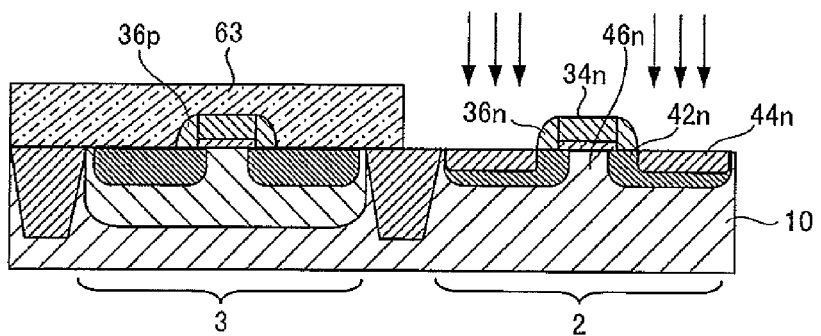

A resist 63 is then formed on the surface of the silicon substrate 10 so as to cover the p-MOS formation region 3. Arsenic ions (75As+) are then implanted with a dose of $5.0 \times 10^{15}$ atoms/$cm^2$ and an implantation energy of 50 key into the surface of the silicon substrate 10 so that an n-type high-concentration impurity layer 44n corresponding to a drain and a source is formed at both sides of the gate electrode 34n interposed therebetween. The ion implantation is carried out at an implantation angle of 0°. The gate electrode 34n and the sidewall 36n function as a mask so that the high-concentration impurity layer 44n is formed at a position apart from the gate electrode 34n and the channel region within the low-concentration impurity layer 42n. An LDD structure is thus formed in which the low-concentration impurity layer 42n intervenes between the high-concentration impurity layer 44n and a channel region 46n (FIG. 4C).

Figure 4D:
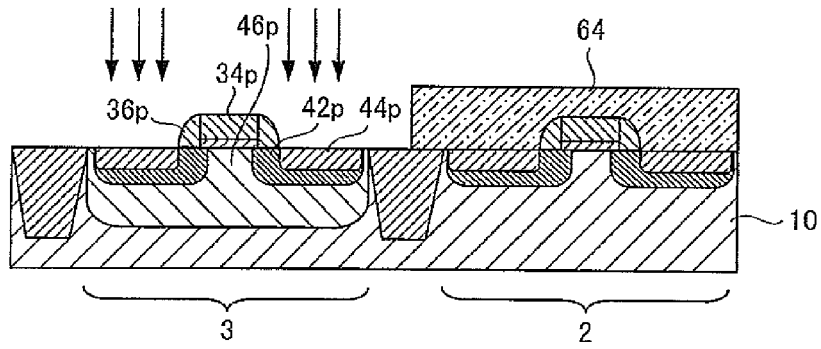

A resist 64 is then formed on top of the silicon substrate 10 in such a manner as to cover the n-MOS formation region 2. Boron ions (11B+) are then implanted into the surface of the silicon substrate 10 so that a p-type high-concentration impurity layer 44p corresponding to a drain and a source is formed at both sides of the gate electrode 34p interposed therebetween. The ion implantation is carried out at an implantation angle of 0°. The gate electrode 34p and the sidewall 36p function as a mask so that the high-concentration impurity layer 44p is formed at a position apart from the gate electrode 34p and a channel region 46p within the low-concentration impurity layer 42p. An LDD structure is thus formed in which the low-concentration impurity layer 42p intervenes between the high-concentration impurity layer 44p and a channel region 46p (FIG. 4D). Afterward, a CMOS-type IC is completed by way of a publicly known wiring step.

As is apparent from the above description, according to the manufacturing method of this embodiment, even though an ion implantation is carried out at a tilt angle having a gate width direction component orthogonal to the gate length direction when forming a low-concentration impurity layer, both end faces of the gate electrode in the gate width direction are covered by the resist mask previous to the execution of the ion implantation, whereupon an ion implantation to the channel region immediately under the gate electrode is prevented so that a formation of the leak path within the channel region can be prevented. As a result, the gate electrode can have a smaller dimension in the gate width direction than the prior art, contributing to a reduction in the size and an increase in the density of the semiconductor device. Any additional steps are not required since the resist mask covering the both end faces of the gate electrode can be formed through the same process step as that of forming an existing resist mask for impeding the ion implantation to the other regions.

Figure 7:
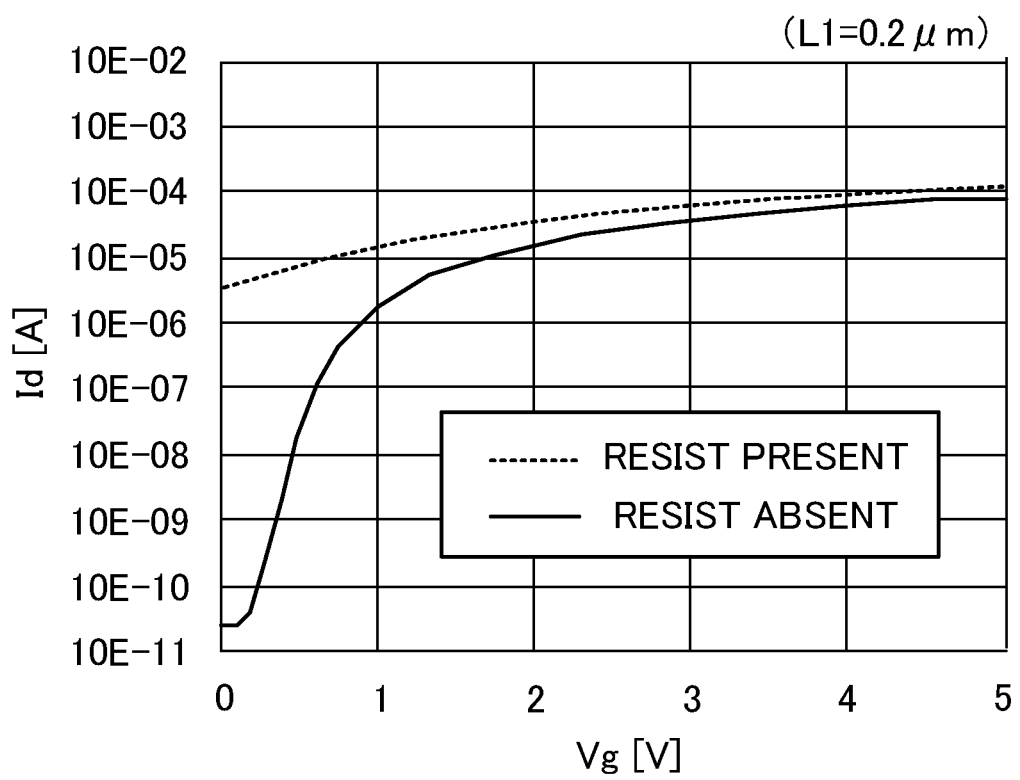
FIG. 7 is a graphical representation of the leakage current characteristic of the MOSFET.

FIG. 7 is a graph representing a result of the comparison of the leakage current between a case (solid line) of the both end faces of the gate electrode covered by the resist mask and a case (broken line) of not covered, where the extension length L1 of the gate electrode from the active area is 0.2 μm that is shorter than the prior art. It can be understood that the leakage current is reduced to a great extent by impeding the ion implantation to the channel region through the covering of the both end faces of the gate electrode by the resist as in this embodiment.

The present invention has described hereinabove referring to the preferred embodiment thereof. It is to be appreciated that various changes or alterations are conceivable to those skilled in the art. It is natural that such variants or modifications are all encompassed within the scope of the appended claims.

Japanese Patent Application No. 2010-263486 upon which this application is based is incorporated herein by reference.

What is claimed is:

1. A method of manufacturing a semiconductor device, comprising the steps of:

forming a gate electrode on a surface of a semiconductor substrate;

forming a resist mask covering both end faces of the gate electrode in a gate width direction intersecting a gate length direction;

forming a low-concentration impurity layer in the surface of the semiconductor substrate so as to overlap with the gate electrode at both sides of the gate electrode by implanting impurity ions into the semiconductor substrate in an implantation direction having a gate length direction component and a gate width direction component;

forming a sidewall covering a side surface of the gate electrode; and forming a high-concentration impurity layer in the surface of the semiconductor substrate so as to be apart from the gate electrode at both sides of the gate electrode by implanting impurity ions using the gate electrode and the side wall as a mask, wherein the resist mask has a covering thickness sufficient to prevent a penetration into a region immediately under the gate electrode of impurity ions implanted in an implantation direction having the gate width direction component at the step of forming the low-concentration impurity layer.

2. The manufacturing method of claim 1, wherein at the step of forming the low-concentration impurity layer, the impurity ions are implanted at a predetermined tilt angle with respect to the surface of the semiconductor substrate.

3. A method of manufacturing a semiconductor device including a plurality of semiconductor elements each having a gate length direction different from one another, the method comprising the steps of:

forming a plurality of gate electrodes corresponding respectively to the plurality of semiconductor elements on a surface of a semiconductor substrate;

forming a resist mask covering both end faces of each of the plurality of gate electrodes in a gate width direction intersecting the gate length direction;

forming a low-concentration impurity layer in the surface of the semiconductor substrate so as to overlap with each of the plurality of gate electrodes at both sides of the each of the plurality of gate electrodes by implanting impurity ions into the semiconductor substrate in an implantation direction having a gate length direction component and a gate width direction component;

forming a sidewall covering a side surface of each of the plurality of gate electrodes; and forming a high-concentration impurity layer in the surface of the semiconductor substrate so as to be apart from each of the plurality of gate electrodes at both sides of the each of the plurality of gate electrodes by implanting impurity ions using the plurality of gate electrodes and the side walls as a mask, wherein the resist mask has a covering thickness sufficient to prevent a penetration into a region immediately under the gate electrode of impurity ions implanted in an implantation direction having the gate width direction component at the step of forming the low-concentration impurity layer.

4. The manufacturing method of claim 3, wherein the semiconductor device includes as the semiconductor elements an n-type MOSFET and a p-type MOSFET, wherein the step of forming a low-concentration impurity layer includes a step of forming a resist mask covering either one of the n-type MOSFET and the p-type MOSFET, and wherein the resist mask covering both end faces of each of the gate electrodes and the resist mask covering either one of the n-type MOSFET and the p-type MOSFET are formed at the same step.

5. The manufacturing method of claim 3, wherein at the step of forming the low-concentration impurity layer, the impurity ions are implanted at a predetermined tilt angle with respect to the surface of the semiconductor substrate.

\* \* \* \* \*